(12) United States Patent
Chen et al.

(10) Patent No.: US 12,113,454 B2
(45) Date of Patent: Oct. 8, 2024

(54) LLC RESONANT CONVERTER WITH WINDINGS FABRICATED ON PCB

(71) Applicant: PHIHONG TECHNOLOGY CO., LTD., Taoyuan (TW)

(72) Inventors: Chun-Chen Chen, Taoyuan (TW); Jian-Hsieng Lee, Taoyuan (TW); Yao-Chun Tung, Taoyuan (TW)

(73) Assignee: PHIHONG TECHNOLOGY CO., LTD., Taoyuan (TW)

( * ) Notice: Subject to any disclaimer, the term of this patent is extended or adjusted under 35 U.S.C. 154(b) by 186 days.

(21) Appl. No.: 17/966,834

(22) Filed: Oct. 15, 2022

(65) Prior Publication Data

US 2024/0079965 A1    Mar. 7, 2024

(30) Foreign Application Priority Data

Sep. 5, 2022   (TW) .................................. 111133617

(51) Int. Cl.
| | | |
|---|---|---|
| *H02M 1/00* | (2007.01) | |
| *H02M 3/00* | (2006.01) | |
| *H02M 3/335* | (2006.01) | |
| *H02M 7/48* | (2007.01) | |
| *H02M 7/5387* | (2007.01) | |
| *H05K 1/18* | (2006.01) | |

(52) U.S. Cl.
CPC ....... *H02M 7/4815* (2021.05); *H02M 7/5387* (2013.01); *H05K 1/181* (2013.01); *H02M 1/0077* (2021.05); *H02M 3/01* (2021.05); *H02M 3/33571* (2021.05); *H02M 3/33592* (2013.01)

(58) Field of Classification Search
CPC .. H02M 1/0077; H02M 3/01; H02M 3/33571; H02M 3/33592
See application file for complete search history.

(56) References Cited

U.S. PATENT DOCUMENTS

| | | | | |
|---|---|---|---|---|
| 2013/0265804 | A1* | 10/2013 | Fu ..................... | H02M 3/33576 363/17 |
| 2014/0254203 | A1* | 9/2014 | Dai ........................ | H02M 3/01 363/17 |
| 2015/0124489 | A1* | 5/2015 | Dai ....................... | H02M 3/335 363/17 |
| 2015/0124492 | A1* | 5/2015 | Fu ..................... | H02M 3/33546 363/21.02 |

(Continued)

*Primary Examiner* — Gary A Nash
(74) *Attorney, Agent, or Firm* — Chih Feng Yeh; Yongjean Consulting Inc.

(57) ABSTRACT

An LLC resonant converter includes a switching circuit for converting a DC voltage into switching signal, a resonant tank coupled to the switching circuit to receive the switching signal and to provide a primary current, a transformer circuit coupled to the resonant tank. The transformer circuit includes a plurality of separated transformers, each has a primary side and a secondary side windings disposed on the PCB, where the primary side winding of each transformer can be selected to couple in series or in parallel with the primary side winding of other transformers to form a dynamically varied equivalent primary side winding, maintaining the turns ratio to fine-tune the resonant tank. The gain curve of the LLC converter can be adjusted by electrically coupling an external excitation inductor, a resonant capacitor or a resonant inductor to the resonant tank, according to the demand of output current.

20 Claims, 8 Drawing Sheets

(56) References Cited

U.S. PATENT DOCUMENTS

2018/0138801 A1* 5/2018 Chen .................... H01F 27/2804
2020/0083817 A1* 3/2020 Liu ......................... H02M 1/08
2020/0083818 A1* 3/2020 Lin ....................... H02M 3/285
2020/0204079 A1* 6/2020 Guo ...................... H02M 3/285
2020/0328696 A1* 10/2020 Dehem ............. H02M 3/33571

* cited by examiner

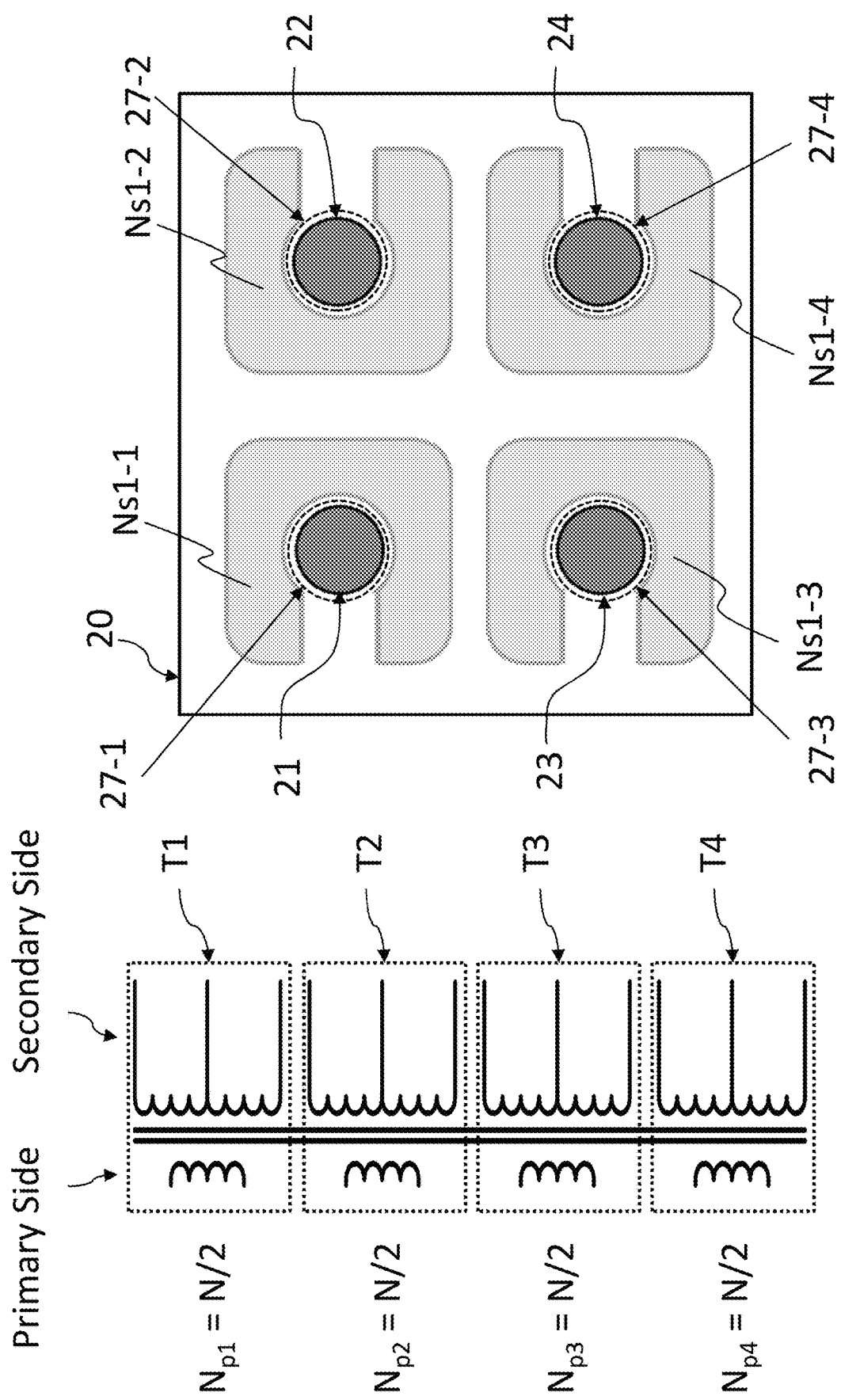

LLC RESONANT CONVERTER WITH WINDINGS FABRICATED ON PCB

CROSS-REFERENCE STATEMENT

The present application is based on, and claims priority from, Taiwan Patent Application Number 111133617, filed Sep. 5, 2022, the disclosure of which is hereby incorporated by reference herein in its entirety.

BACKGROUND

Technical Field

The present invention relates to an LLC converter, and more particularly, an LLC resonant converter with windings fabricated on printed circuit board (PCB).

Related Art

In conventional switching power supplies, their magnetic components are usually employed for filtering, energy storage and transmission purposes. During the operation of the switching power supply, the higher switching frequency of the switching device, the smaller size of the magnetic element can be realized, and it is easier to achieve miniaturization, weight reduction and cost reduction of the power supply device. Increasing the switching frequency of the switching power supply will also correspondingly increase the switching loss of the switching device, so the soft-switching technology emerges as the time being evolved. To achieve ideal soft switching, the best scenario is to have the switching device turn off and on when both the voltage and current are zero (zero-voltage switching, ZVS; zero-current switching, ZCS), so that the loss occurred is really zero. For achieving this purpose, a resonance technology must be utilized.

Based on the principle of the circuitry operation, an inductor and a capacitor can be connected in series or in parallel to form a resonant circuit, when the power supply is a DC power supply, the current in the resonant circuit changes according to a sinusoidal law. Since the current or voltage varies based on the sinusoidal law, there is a zero-crossing point, and if the switching device is turned on or off at this moment, the resulting loss is zero.

The LLC converter is a resonant inverter with three reactive elements where the DC input voltage is turned into a square wave by a switch network arranged as either a half- or full-bridge to feed the resonant LLC tank that effectively filters out harmonics providing a sinusoidal like voltage and current waveform. This in turn feeds a transformer that provides voltage scaling and primary-secondary isolation. The converter power flow is controlled by modulating the square wave frequency with respect to the tank circuit's resonance. In an LLC resonant converter, all semiconductor switches are soft-switching, or zero-voltage switching (ZVS), at turn-on for the primary MOSFETs and zero-current switching (ZCS) at both turn-on and turn-off for the rectifiers in the secondary; resulting in low electro-magnetic emissions levels (EMI). In addition, it can enable a high degree of integration in the magnetic parts, enabling the design of converters with higher efficiency and power density.

An LLC resonant power converter is a topology of a series resonant converter that provides an output voltage signal that is isolated from the input signal. The LLC resonant power converter includes a series resonant circuit connected in series with the primary winding of the transformer. A switching circuit alternately couples the switching node of the resonant circuit to the positive supply node and the ground node to provide an AC resonant current flowing through the primary winding of the transformer. A secondary circuit, such as a rectifier, provides the output voltage to drive a load. Where the secondary circuit may comprise a synchronous rectifier switch or a diode rectifier. The primary side switching circuit can be adjusted to regulate the output voltage. The LLC resonant converter has high efficiency and high power density, and can provide zero-voltage switching and low turn-off current for primary side switches over a fairly wide load range. These advantages make the LLC resonant converter suitable for a variety of applications, such as high-performance servers and telecom applications.

As mentioned earlier, when the primary side switching frequency is lower than the resonant frequency, the primary side switches can be turned off with zero current switching. This helps increasing the capability of voltage gain without reducing the efficiency of applications with hold-up time requirements. The size of the magnetic elements and capacitors of the LLC resonant power converter can be reduced while operating the LLC resonant converter at high switching frequencies. However, this increases switching-related losses and magnetic-component losses, resulting in inefficiencies. Magnetic components used in the LLC resonant power converter remain as a limitation in improving converter efficiency due to core and winding losses, especially at high switching frequencies. Further improvements are required to support higher efficiency and power density of the LLC resonant power converter.

The magnetic components of the traditional LLC resonant converter are large in size, the magnetic core and winding cannot be reduced in size due to the limitation of power and operating frequency, and the parameters of the resonant tank of the LLC resonant converter cannot be changed. This issue might cause the LLC resonant converter cannot be operated due to the required output voltage or current exceeding the original design of the resonant tank. How to efficiently improve the power density and widen the range of output voltage and current of the LLC resonant converter are the challenges need to be faced during the course of developing the LLC resonant converter.

Therefore, to obtain a larger range of output voltage and current, and to improve the power density of power converter by introducing the magnetic flux cancellation technology to reduce the size of the magnetic components, making the transformer windings on the printed circuit board, reducing the stray characteristics of the magnetic components, and changing the parameters of the resonant tank have became urgent needs to improve the deficiencies of the existing LLC resonant converters.

SUMMARY

According to the design concept mentioned above, in one aspect of the present invention an LLC converter is proposed, which includes a switching circuit electrically coupled to an input DC voltage for converting the input DC voltage into a switching signal; a resonant tank electrically coupled to the switching circuit, the resonant tank including a resonant inductor, a magnetizing inductor and a resonant capacitor connected in series to receive the switching signal for providing primary current; a transformer circuit electrically coupled to the resonant tank, the transformer circuit having a plurality of discrete transformers, each of the plurality of discrete transformers with a primary winding and a secondary winding, wherein the primary winding and the secondary winding are fabricated on a printed circuit board (PCB) to reduce influence of stray characteristics caused by the primary winding and the secondary winding; wherein primary winding of each of the discrete transformers is dynamically selected to be electrically coupled or isolated from the resonant tank, and is dynamically selected to be connected in series or in parallel with the primary winding of other discrete transformers to form a dynamically varying equivalent primary winding, and enable parameters of the resonant tank to be tuned accordingly while maintaining turns ratio of the transformer circuit; and a rectifying and filtering circuit electrically coupled to the transformer circuit to rectify and filter a secondary current for providing an output voltage; wherein one end of the resonant inductor is connected in series to the switching circuit and another end of the resonant inductor is connected in series to the equivalent primary winding; wherein the magnetizing inductor is connected in series to the resonant capacitor, the resonant capacitor with one end is connected in series to the magnetizing inductor and another end is connected to the switching circuit; and wherein the magnetizing inductor is connected in parallel to the equivalent primary winding; wherein gain curve of the LLC resonant power converter is dynamically adjusted by electrically coupling an external excitation inductor, an external resonant inductor or an external capacitor to the resonant tank according to output current requirement of the LLC resonant power converter.

In one preferred embodiment, the equivalent primary winding of the transformer circuit, the external magnetizing inductor, the external resonant inductor or the external capacitor electrically coupled to the resonant tank is dynamically adjusted by configuring a plurality of switches in the LLC converter.

In one preferred embodiment, the plurality of switches are switching devices, transistors, relays or the like.

In one preferred embodiment, inductance of the external magnetizing inductor is leakage inductance of the transformer circuit or inductance of a coupled external inductor, the inductance of the external magnetizing inductor is adjusted through varying windings of magnetic component of the resonant tank or through coupling external magnetic elements in series or in parallel by arranging the plurality of switches.

In one preferred embodiment, the inductance of the external magnetizing inductor is dynamically adjusted by varying one of the parameters of the resonant tank K, which is inductance ratio, enabling that the gain curve of the LLC resonant converter is dynamically varied according to the output current requirement of the LLC resonant power converter.

In one preferred embodiment, the external capacitor is circuit stray capacitor or external capacitor, and capacitance of the resonant tank is varied through adjusting configurations between the external capacitor and the resonant capacitor by arranging the plurality of switches.

In one preferred embodiment, capacitance of the external capacitor is dynamically adjusted by varying one of the parameters of the resonant tank Q, which is quality factor, enabling that the gain curve of the LLC resonant converter is dynamically varied according to the output current requirement of the LLC resonant power converter.

In one preferred embodiment, inductance of the external resonant inductor is leakage inductance of the transformer circuit or inductance of a coupled external inductor, the inductance of the external resonant inductor is adjusted through varying windings of magnetic component of the resonant tank or through coupling external magnetic elements in series or in parallel by arranging the plurality of switches.

In one preferred embodiment, the inductance of the resonant magnetizing inductor is dynamically adjusted by varying two of the parameters of the resonant tank K and Q, which are inductance ratio and quality factor respectively, enabling that the gain curve of the LLC resonant converter is dynamically varied according to the output current requirement of the LLC resonant power converter.

In one preferred embodiment, the plurality of switches are configured to dynamically adjust parameters of the resonant tank and winding configuration of the transformer circuit by sending resonance tank adjustment signals to the resonant tank and the transformer circuit through an external controller electrically coupled to the LLC resonant converter, according to received feedback of output voltage and feedback of output current respectively to adjust range of output voltage and output current of the LLC resonant power converter.

According to another aspect of the present invention, an LLC converter is proposed, which includes a switching circuit electrically coupled to an input DC voltage for converting the input DC voltage into a switching signal; a resonant tank electrically coupled to the switching circuit, the resonant tank including a resonant inductor, a magnetizing inductor and a resonant capacitor connected in series to receive the switching signal for providing primary current; a transformer circuit electrically coupled to the resonant tank, the transformer circuit having a plurality of discrete transformers, each of the plurality of discrete transformers with a primary winding and a secondary winding, wherein the primary winding and the secondary winding are fabricated on a printed circuit board (PCB) to reduce influence of stray characteristics caused by the primary winding and the secondary winding, wherein the PCB include a plurality of through holes, a plurality of layers and a plurality of windings, and locations of the plurality of through holes corresponding to the magnetic cores of the plurality of discrete transformers to make each of the magnetic cores passing through corresponding the plurality of through holes; wherein the plurality of windings arranged on each layer of the plurality of layers of the PCB surround corresponding magnetic cores of the plurality of discrete transformers to generate induced electromotive force, the windings arranged on the plurality of layers of the PCB include the primary winding or the secondary side winding; wherein primary winding of each of the discrete transformers is dynamically selected to be electrically coupled or isolated from the resonant tank, and is dynamically selected to be connected in series or in parallel with the primary winding of other discrete transformers to form a dynamically varying equivalent primary winding, and enabling parameters of the resonant tank to be tuned accordingly while maintains turns ratio of the transformer circuit; and a rectifying and filtering circuit electrically coupled to the transformer circuit to rectify and filter a secondary current for providing an output voltage; wherein one end of the resonant inductor is connected in series to the switching circuit and another end of the resonant inductor is connected in series to the equivalent primary winding; wherein the magnetizing inductor is connected in series to the resonant capacitor, the resonant capacitor with one end is connected in series to the magnetizing inductor and another end is connected to the switching circuit; wherein the magnetizing inductor is connected in parallel to the equivalent primary winding; and wherein gain curve of the LLC resonant power converter is dynamically adjusted by electrically coupling an external excitation inductor, an external resonant inductor or an external capacitor to the resonant tank according to output current requirement of the LLC resonant power converter.

BRIEF DESCRIPTION OF THE DRAWINGS

The components, characteristics and advantages of the present invention may be understood by the detailed descriptions of the preferred embodiments outlined in the specification and the drawings attached:

FIG. 2(A) illustrates a schematic circuit diagram of a transformer winding of the LLC resonant power converter fabricated on printed circuit boards according to one embodiment of the present invention.

FIG. 2(B) illustrates a top view of a transformer winding of the LLC resonant power converter fabricated on printed circuit board according to one embodiment of the present invention.

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

As mentioned in the background section, the magnetic components of the traditional LLC resonant converter are large in size, the magnetic core and winding cannot be reduced in size due to the limitation of power and operating frequency, and the parameters of the resonant tank of the LLC resonant converter cannot be changed. This issue might cause the LLC resonant converter cannot be operated due to the required output voltage or current exceeding the design of the resonant tank. How to efficiently improve the power density and widen the range of output voltage and current of the LLC resonant converter are the challenges need to be faced during the course of developing the LLC resonant converter.

Figure 1:
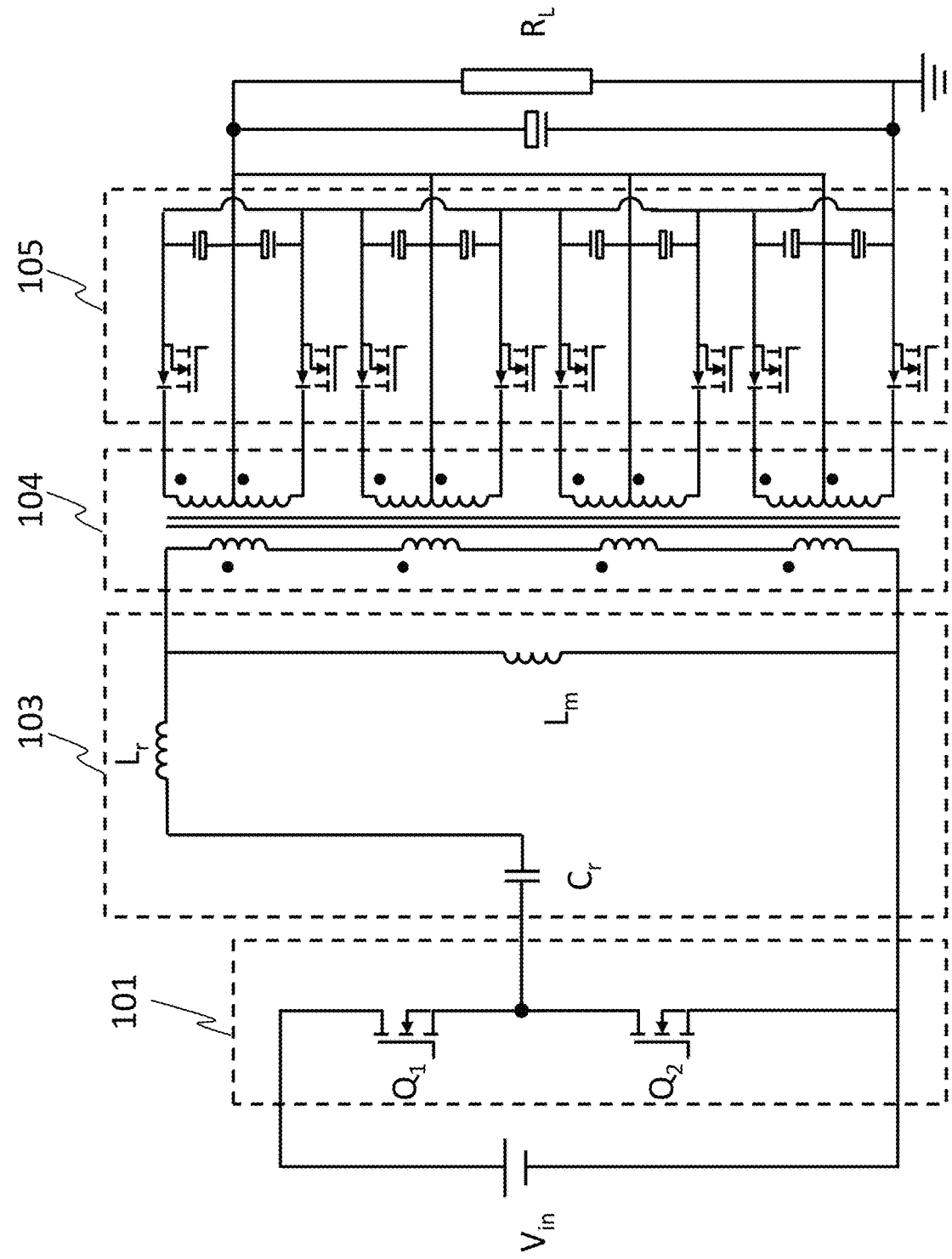
FIG. 1 illustrates a schematic circuit diagram of an LLC resonant converter according to prior art.

FIG. 1 is a schematic circuit diagram of an existing LLC resonant converter 100, which adopts a half-bridge LLC resonant converter with an array transformer core integrated with synchronous rectification functionality. The LLC resonant converter is used to convert the DC input voltage $V_{in}$ into the DC output voltage $V_o$ for supplying to the load $R_L$, which includes a half-bridge switching circuit 101, a resonant tank 103, a transformer circuit 104 and a rectifying and filtering circuit 105. The half-bridge switching circuit 101 is used to control the input of the DC voltage $V_{in}$. The resonant tank 103 is electrically coupled to the switching circuit 101 and includes a resonant inductor $L_r$, a magnetizing inductor $L_m$ and a resonant capacitor $C_r$ connected in series. The transformer circuit 104 is electrically coupled to the resonant tank 103 and includes magnetic cores to form an array-typed transformer, primary side windings, and secondary side windings. The rectification form of the secondary side windings is center-tapped type rectifying circuit, which is rectified through the rectification switches.

During the operation of the LLC resonant converter 100, the output/input nodes of the half-bridge switching circuit 101 are turned ON or OFF repeatedly due to the periodic switching of the switches to generate a periodically changing switching signal. When the signal is fed to the resonant tank 103, the magnetizing inductor $L_m$ is excited to repeatedly generate voltage and induction electromotive force. Since the primary windings of the transformer circuit 104 is connected in series with the resonant inductor $L_r$ and the resonant capacitor $C_r$ of the resonant tank 103, and is connected in parallel with the magnetizing inductor $L_m$, enabling the formation of the primary side current in the circuit that changes according to the sinusoidal law, and the secondary side windings of the transformer circuit 104 continue to generate periodically varying current, which are rectified and filtered by the rectifying and filtering circuit 105 to convert the periodically varying current into output DC current for providing DC output voltage $V_o$ to the load $R_L$. Basically, once the circuit topology of the LLC resonant converter 100 is finalized, its resonant tank parameters are then determined and cannot be adjusted for different operating scenarios. That is, output voltage or output current range of the LLC resonant converter 100 cannot be adjusted according to its operational needs.

In order to improve the power density of LLC resonant converter and to increase its range of output voltage or current. The present invention proposes to improve the power density of power converter by introducing the magnetic flux cancellation technology to reduce the size of the magnetic components, making the transformer windings on the printed circuit board (PCB), reducing the stray characteristics of the magnetic components, and changing the parameters of the resonant tank.

The technical means proposed by the present invention is to design the windings on the PCBs to reduce the influence of stray characteristics caused by wiring of the windings. FIG. 2(A) illustrates a schematic circuit diagram of an array-typed transformer winding of the LLC resonant power converter fabricated on PCBs, where the array-typed transformer is a collection of multiple discrete transformers.

FIG. 2(A) illustrates a schematic circuit diagram of an array-typed transformer winding of the LLC resonant power converter fabricated on PCBs. In the embodiment shown in the FIG. 2(A), the transformers (T1, T2, T3, T4) are four discrete transformers, which can be configured into an array. Since the windings of the transformers are designed and fabricated on the PCBs, each of the secondary windings shown in FIG. 2(A) is set to be one turn, and each of the primary windings of the transformers T1-T4 is designed to be N/2 turns. In a case that the primary windings of the transformers T1 and T2 are connected in series, the turns of the individual primary windings is $N_{p1}$=N/2 and $N_{p2}$=N/2 respectively, the combined turns (effective turns) of the primary windings are N turns, and the turns ratio of the combined transformer is N:1. Similarly, in a case that the primary windings of the transformers T1 and T3 are connected in series, the turns ratio is also N:1, but the combined transformer for connecting T1 and T3 having its inductance of resonant inductor $L_r$, inductance of magnetizing inductor $L_m$ and stray capacitance are different from that of combined transformer for connecting T1 and T2. Also, in the case that the primary windings of the transformers T1 and T4 are connected in series, the turns ratio is still N:1, but the combined transformer for connecting T1 and T4 having its inductance of resonant inductor $L_r$, inductance of magnetizing inductor $L_m$ and stray capacitance are different from that of combined transformer for connecting T1 and T2 or combined transformer for connecting T1 and T3. Even the turns ratio of different combined transformer, by connecting two individual transformers, remains the same, but the relative position and distance between the windings will change with the series configuration and wiring between two individual transformers. Therefore, the resonant tank parameters, for example, resonant inductance of $L_r$, magnetizing inductance of $L_m$ and the stray capacitance will also change accordingly.

In one embodiment, the planar transformer winding structure 20 fabricated on the PCB includes multiple layers (e.g., four or eight or more layers of PCB), as shown in FIG. 2(B), a plurality of through holes (27-1, 27-2, 27-3 and 27-4) are formed on the multiple layers of PCB for passing the magnetic cores 21, 22, 23 and 24 corresponding to the array-arranged transformers T1, T2, T3 and T4 (or called matrix transformer) respectively, The windings (including the primary side and the secondary side windings) formed on each layer of the PCB can surround the magnetic cores 21, 22, 23 and 24 to generate induced electromotive force. Please refer to FIG. 2(B), Ns1-1, Ns1-2, Ns1-3 and Ns1-4 represent wirings for a plurality of secondary windings fabricated on the first layer (Layer 1) to respectively surround the magnetic cores 21, 22, 23 and 24; Np1-1, Np1-2, Np1-3 and Np1-4 (not shown) represent wirings for a plurality of primary side windings fabricated on the second layer (Layer 2) to respectively surround the magnetic cores 21, 22, 23 and 24; Np2-1, Np2-2, Np2-3 and Np2-4 (not shown) represent wirings of the primary side windings fabricated on the third layer (Layer 3) to respectively surround the magnetic cores 21, 22, 23 and 24; Ns2-1, Ns2-2, Ns2-3 and Ns2-4 represent wirings for a plurality of secondary windings fabricated on the fourth layer (Layer 4) to respectively surround the magnetic cores 21, 22, 23 and 24. The above wirings including primary/secondary windings implemented on PCB can also be called PCB windings, which can be implemented on PCB by providing conductive layers on or embedded within one or more printed circuit board structures comprising, for example, one or more metallic layers on or within a sheet of insulating material.

In an embodiment, the matrix transformer, as mentioned above, generally uses a four-layered PCB board to make the wiring of its windings including primary and secondary windings. Typically but not limited, the wiring of the primary side windings will be made on the second layer (Layer 2) and the third layer while the wiring of the secondary windings will be fabricated on the first layer (Layer 1) and the fourth layer (Layer 4).

In the above examples, only the wiring of transformer windings made of four-layer PCB boards is chosen for illustration. Similar concepts can be extended to wiring of transformer windings fabricated on eight-layer, sixteen-layer or more layers of PCB boards.

Based on the explanations of previous paragraphs, the resonant tank parameters, such as resonant inductance of $L_r$, magnetizing inductance of $L_m$ and the stray capacitance can still be slightly adjusted due to the routing routes variation of the windings between different layers, even if the turns ratio remains unchanged.

According to the concept of the present invention, the transformer winding shown in FIG. 2(A) above is only an example, and the winding configuration of the discrete array transformers between the primary and secondary sides can be varied in different ways, and is not limited to 4 sets of primary side coils coupled to 4 sets of secondary side coils, it is also possible to have 4 sets of primary side coils coupled to 1 set of secondary side coils, or 4 sets of primary side coils coupled to 6 sets of secondary side coils, etc.

The gain of the LLC resonant converter is represent by equation (1), if $L_r$, $L_m$, $C_r$ and N are all fixed values, the gain M($f_s$, K, Q) is determined by the output current $I_o$, the output voltage $V_o$ and the operating frequency $f_s$ of the LLC resonant converter. When $I_o$ and $V_o$ are the target values, the desired gain M($f_s$, K, Q) can be obtained by varying the operating frequency $f_s$.

$$M(f_s, K, Q) = \frac{1}{\sqrt{\left(1 + K - K\left(\frac{f_{r1}}{f_s}\right)\right)^2 + Q^2\left(\frac{f_s}{f_{r1}} - \frac{f_{r1}}{f_s}\right)^2}} \quad (1)$$

Where K=$L_r/L_m$ (inductance ratio), $$Q = \frac{\sqrt{L_r/C_r}\,\pi^2 I_o}{8N^2 V_o}$$

(quality factor), $$f_{r1} = \frac{1}{2\pi\sqrt{L_r C_r}},$$

and N is the turns ratio of the primary/secondary side windings of the transformer.

According to the design concept of the present invention, there exists four ways to adjust parameters of the resonant tank, namely, through (i) adjusting the external $L_m$, (ii) adjusting the external $C_r$, (iii) adjusting the external $L_r$, and (iv) adjusting the series and or/parallel coupling of the transformer windings (including primary and secondary windings) to change the magnetizing inductance of $L_m$ and resonant inductance of the $L_r$.

Figure 2C:
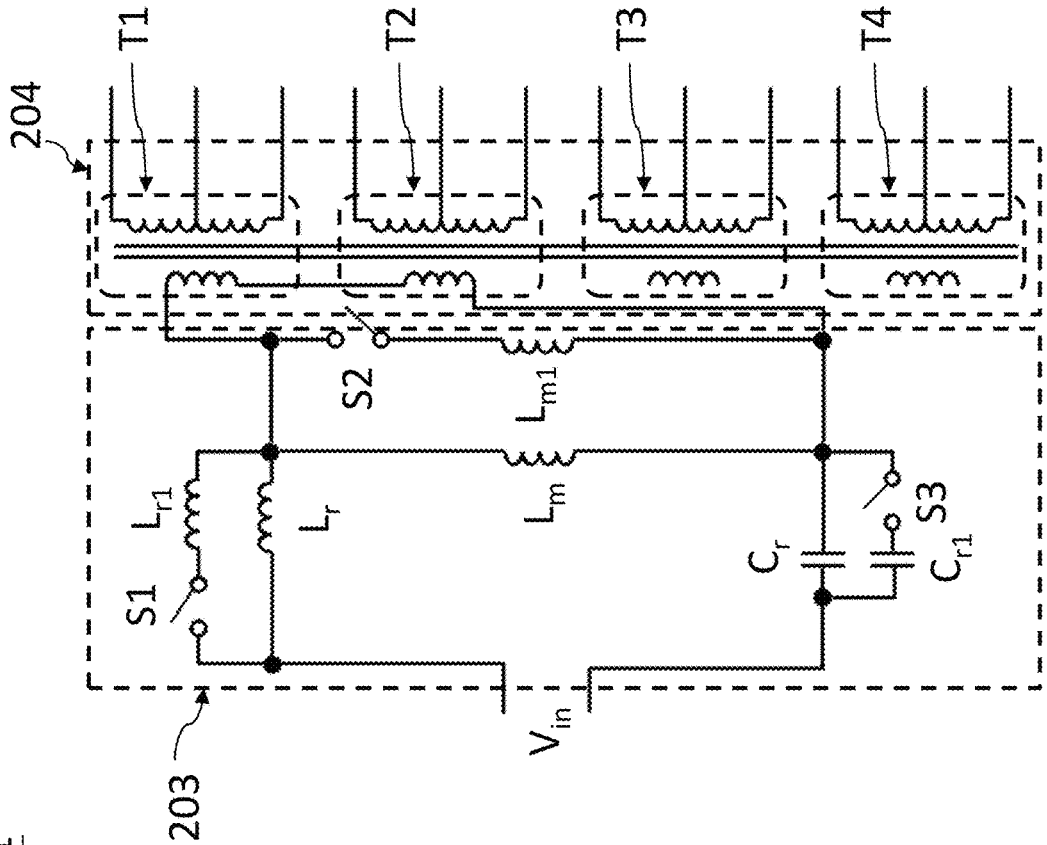
FIG. 2(C) illustrates a schematic circuit diagram of a resonant tank design in an LLC resonant converter with windings fabricated on printed circuit board according to one embodiment of the present invention.

FIG. 2(C) depicts the circuit block 203-1 of resonant tank and transformer circuit of an LLC resonant converter according to one embodiment of the present invention. Where the resonant tank 203 is electrically coupled to the transformer circuit 204. According to the above design concept, as shown in FIG. 2(B), after the winding configuration of the transformer circuit 204 arranged on the printed circuit board being chosen, adjustments of resonant tank can be executed through configuring a plurality of switches S1, S2, S3 . . . to couple the external $L_{m1}$, $L_{r1}$ and $C_{r1}$ with the original resonant tank of the LLC resonant converter. In FIG. 2(C), the circuit block 203-1 only shows that $L_{m1}$, $L_{r1}$ and $C_{r1}$ are connected in parallel with $L_m$, $L_r$ and $C_r$ of the original resonant tank, which is only an example, and other alternative connection methods are also included in the concept of the present invention. The transformer circuit 204 includes four sets of discrete transformers T1, T2, T3 and T4 to form a matrix transformer.

Figure 2D:
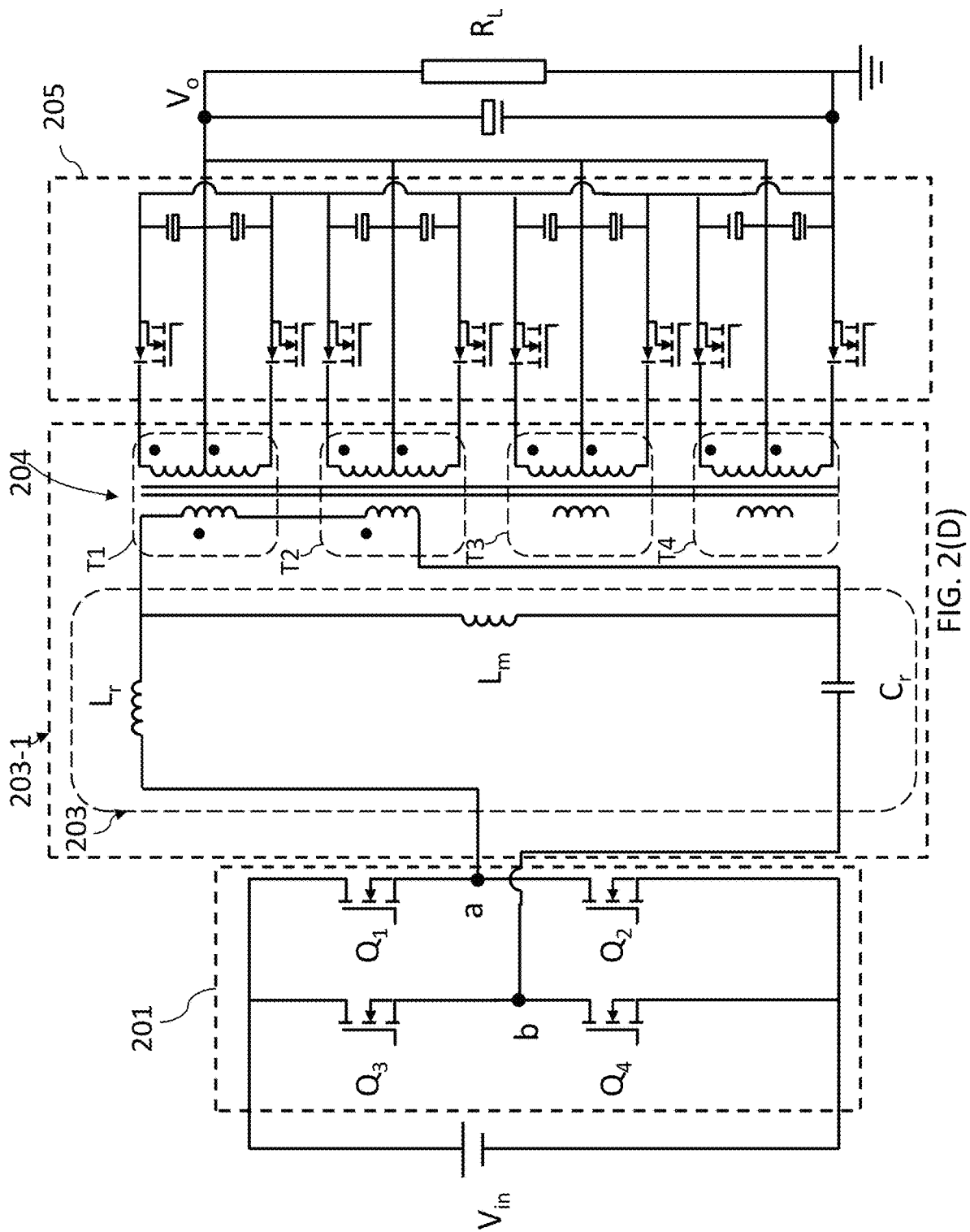
FIG. 2(D) illustrates a schematic circuit diagram of an LLC resonant converter with windings fabricated on printed circuit board according to one embodiment of the present invention.

FIG. 2(D) illustrates a schematic circuit diagram of an LLC resonant converter with windings fabricated on printed circuit boards according to one of the preferred embodiments of the present invention. As shown in FIG. 2(D), the primary windings of transformer T1 and T2 are connected in series, and the turns of the individual primary windings are $N_{p1}$=N/2 and $N_{p2}$=N/2 respectively. The combined turns of the primary windings are N turns, and the turns ratio of the transformer is N:1, which is only used as an example for illustration; from the descriptions of previous paragraphs, even if the turns ratio remains unchanged, the resonant tank parameters, such as resonant inductance of $L_r$, magnetizing inductance $L_m$ and the stray capacitance can still be adjusted due to the electrical connection varied between different transformers.

FIG. 2(D) shows the operation of the LLC resonant power converter of the present invention under the specific configuration of the transformer circuit by taking the series connection of the primary side windings of the transformers T1 and T2 as an example. As shown in FIG. 2(D), the LLC resonant converter is used to convert a DC input voltage $V_{in}$ into a DC output voltage $V_o$ for supplying to the load $R_L$, which includes a full-bridge switching circuit 201, a resonant tank 203, transformer circuit 204 including individual transformers (T1, T2, T3 and T4), a rectifying and filtering circuit 205 and an external control circuit (not shown). In FIG. 2(D), the switching circuit 201 is taking a full-bridge switching circuit as an example but not limited to it, which can also be a half-bridge switching circuit. The rectifying and filtering circuit 205 is electrically coupled to the transformer circuit including a plurality of secondary windings with center-tapped form, each center-tapped secondary winding includes positive half-cycle and negative half-cycle winding, and the positive and negative half-cycle windings are connected in series with a rectifier switch and a capacitor, which are respectively used as positive and negative half-cycle rectification and filtering. The full-bridge switching circuit 201 contains switches Q1, Q2, Q3 and Q4, during the positive half-cycle operation mode, the primary side upper bridge switch Q1 and the primary side lower bridge switch Q4 are turned on while the primary side upper bridge switch Q3 and the primary side lower bridge switch Q2 are turned off, and the current flows through $L_r$, primary windings of transformers T1 and T2, $L_m$ connected in parallel with the primary windings of the transformers T1 and T2, and $C_r$, and then are rectified and filtered by the upper half-cycle windings of the respectively coupled secondary windings to generate the output voltage $V_o$, which is provided to the load $R_L$ for use; during the negative half-cycle operation mode, the primary side upper bridge switch Q3 and the primary side lower bridge switch Q2 are turned on while the primary side upper bridge switch Q1 and the primary side lower bridge switch Q4 are turned off, and the current flows through $L_r$, primary windings of transformers T1 and T2, $L_m$ connected in parallel with the primary windings of the transformers T1 and T2, and $C_r$, and then are rectified and filtered by the lower half-cycle windings of the respectively coupled secondary windings to generate the output voltage $V_o$, which is provided to the load $R_L$ for use.

The circuit block 203-1 of the resonant tank 203 and the transformer circuit 204 shown in FIG. 2(C) can have different variations. The influences of these variations on the voltage gain values of the LLC resonant power converter will be discussed in subsequent paragraphs and further detailed in FIGS. 3-5 and their corresponding descriptions.

Figure 3A:
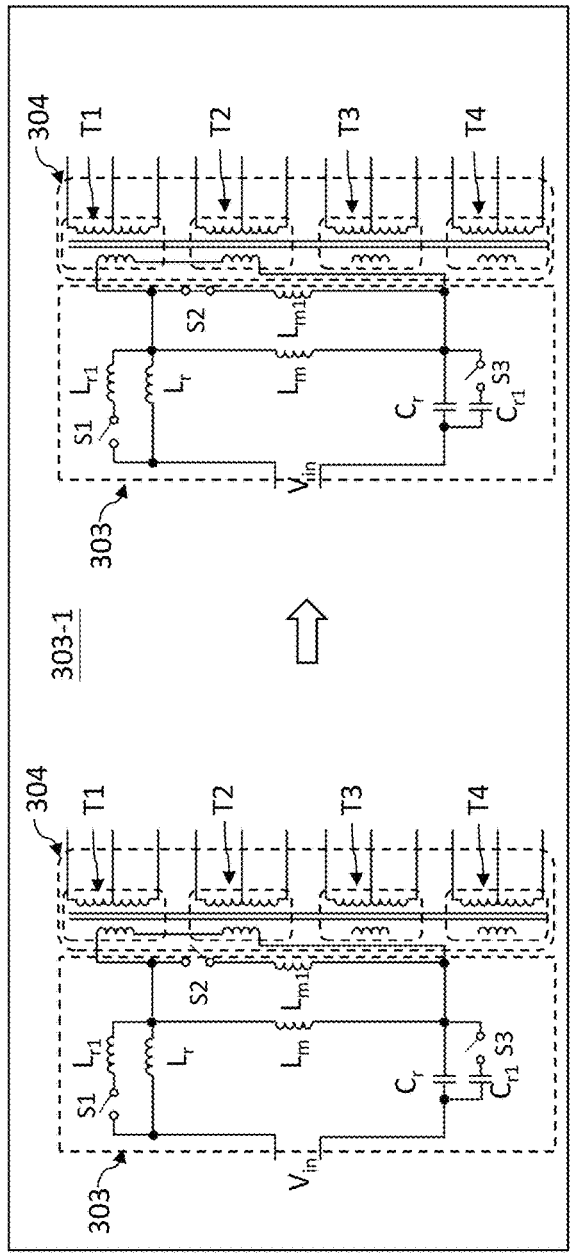
FIG. 3(A) illustrates a schematic circuit diagram of a resonant tank design of an LLC resonant converter according to one embodiment of the present invention.
Figure 3B:
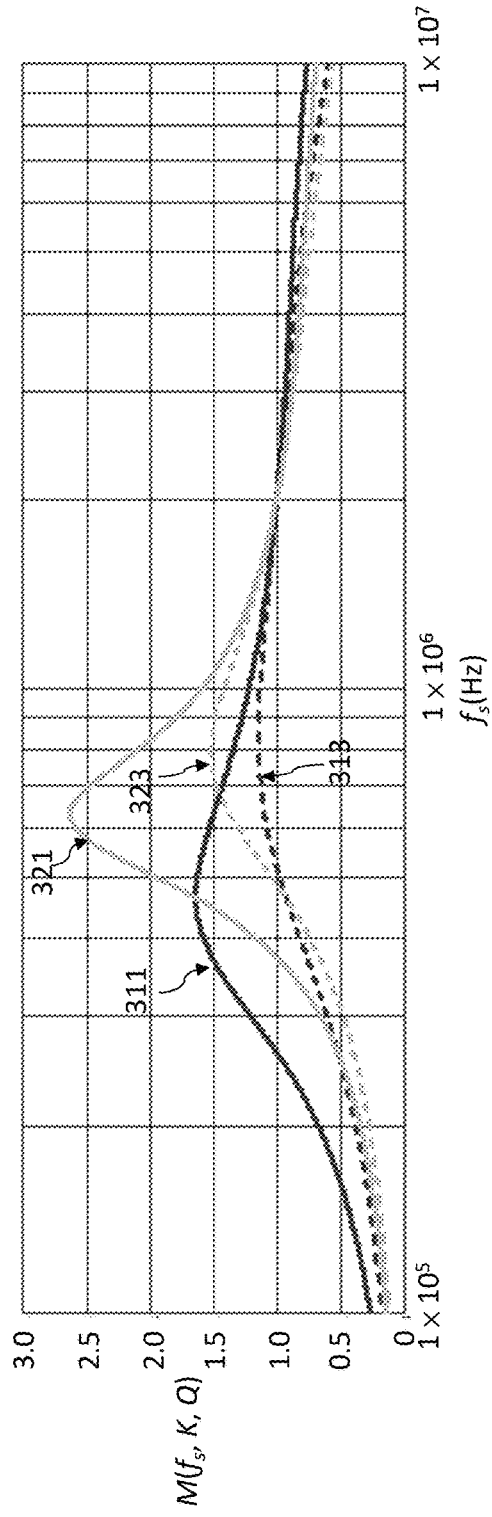
FIG. 3(B) illustrates comparison of gain curves between the proposed resonant tank design according to FIG. 3(A) and the original resonant tank design.

FIG. 3(A) shows the circuit block 303-1 of the resonant tank 303 coupled to the transformer circuit 304 of the circuit of the LLC resonant power converter with PCB windings proposed according to one of the embodiments of the present invention. According to the above design concept, after the primary side windings of the transformer are configured and arranged in series (for example, the primary side windings of the transformers T1 and T2 are connected in series, and the transformers T3 and T4 are disconnected), i.e., the initial state, the parameters of the resonant tank are fixed, that is, the resonant tank in the diagram (left of FIG. 3(A)), the switches S1, S2 and S3 are turned off. In the initial state, while the parameters of the resonant are fixed, varying the values of $I_o$ and $V_o$ will also change the Q value. In the initial state, curves depict gain $M(f_s, K, Q)$ of the LLC resonant converter versus the operating frequency $f_s$ according to the change of the Q values are illustrated as curves 311 and 313 in FIG. 3(B). In the initial state, if the required $I_o$ of the LLC resonant converter increase, the value of Q changes from Q1 to Q2, and the maximum DC gain change from more than 1.5 (curve 311) to lower than 1.5 (curve 313), the LLC resonant converter cannot be operated to obtain the required gain value (a threshold gain value). At this moment, if the switch S2 is turned on (i.e., the right of FIG. 3(A)), compared with the initial state, the $L_m$ value of the resonant tank will be changed from a fixed value to a variable $L_m'$ (i.e. $L_m//L_{m1}$), which includes the initial fixed magnetizing inductor electrically coupled to the first inductor $L_{m1}$, and the equivalent resonant tank parameter $L_m'$ (that is, the variable magnetizing inductance) can be adjusted by turning on the switch S2 to obtain the varied K1 parameter (varied from K to K1), as shown in FIG. 3(B). In this case, if the required $I_o$ of the LLC resonant converter increases, the value of Q changes from Q1 to Q2, corresponding curves depict gain $M(f_s, K, Q)$ of the variable LLC resonant converter versus operating frequency $f_s$ according to the change of the values of Q are illustrated as curves 321 and 323 in FIG. 3(B). That is, under K1, while the curves of gain $M(f_s, K, Q)$ of LLC resonant converter varies from Q1 to Q2, the corresponding maximum DC gain of Q2 (curve 323) is still greater than the threshold value 1.5, which can meet the gain requirement of the LLC resonant converter.

The examples mentioned above are only examples to illustrate how to adjust the parameters of the resonant tank by adjusting the external $L_m$, and the ways of electrical coupling between $L_m$ and $L_{m1}$ can be selected in series or in parallel according to different applications, such as printed circuit boards with different layers.

In an embodiment, the inductance of the first inductor $L_{m1}$ can be the leakage inductance of the transformer itself or external coupled inductance, which can be obtained through changing the windings of the magnetic element by any form of switches such as a switching element or a relay, or through connecting external magnetic element in series or in parallel. In this way, the inductance value in the resonant tank can be adjusted, and then the resonance parameter K (i.e., inductance ratio $L_r/L_m$) is dynamically adjusted, so that the gain curve $M(f_s, K, Q)$ can be dynamically adjusted according to the $I_o$ requirement.

Figure 4A:
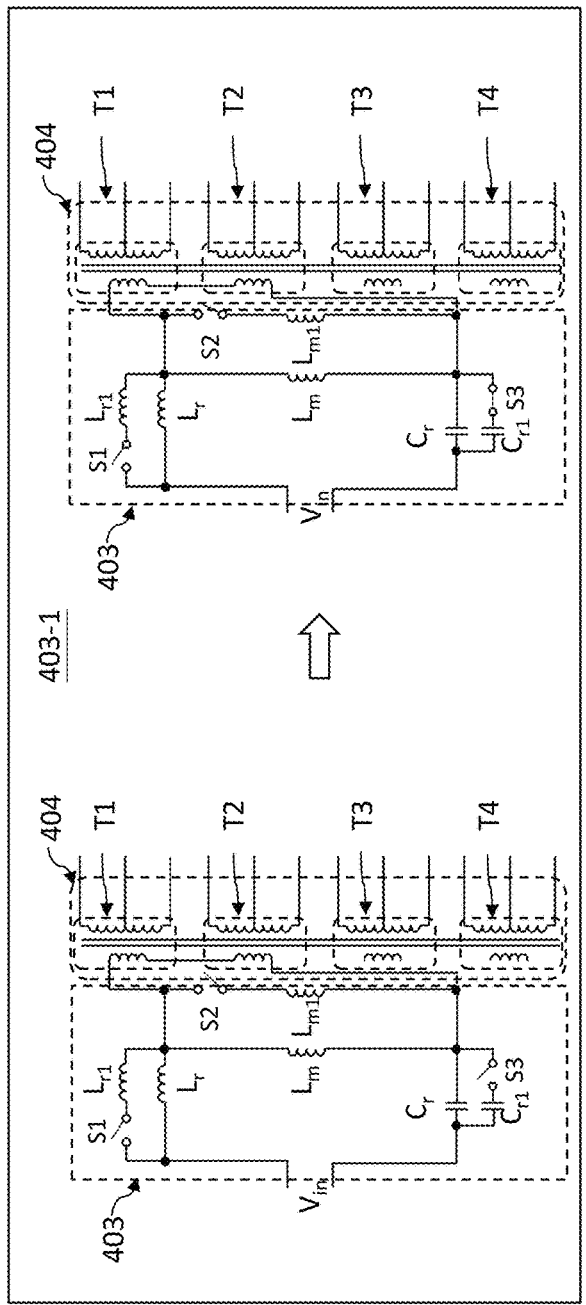
FIG. 4(A) illustrates a schematic circuit diagram of a resonant tank design of an LLC resonant converter according to the other embodiment of the present invention.
Figure 4B:
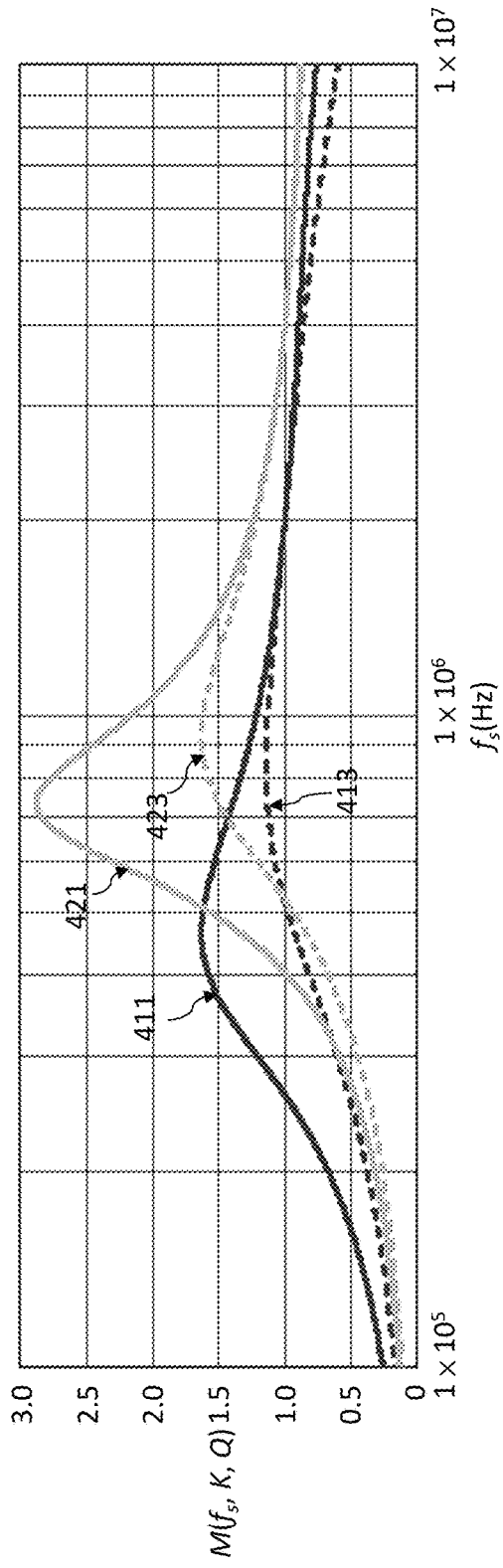
FIG. 4(B) illustrates comparison of gain curves between the proposed resonant tank design according to FIG. 4(A) and the original resonant tank design.

FIG. 4(A) shows the circuit block 403-1 of the resonant tank 403 coupled to the transformer circuit 404 of the circuit of the LLC resonant power converter with PCB windings and also illustrates how to change the resonant tank by adjusting the external $C_r$ after the transformer primary side windings are selected and configured in series (same as FIG. 3). In the initial state, the parameters of the resonant tank are fixed, that is, the resonant tank in the diagram (left of FIG. 4(A)), the switches S1, S2 and S3 are turned off. In the initial state, while the parameters of the resonant are fixed, varying the values of $I_o$ and $V_o$ will also change the Q value. In the initial state, curves depict gain $M(f_s, K, Q)$ of the LLC resonant converter versus operating frequency $f_s$ according to the change of the values of Q are illustrated as curves 411 and 413 in FIG. 4(B). In the initial state, if the required $I_o$ of the LLC resonant converter increases, the value of Q changes from Qa to Qb, and the maximum DC gain changes from more than 1.5 (curve 411) to lower than 1.5 (curve 413), the LLC resonant converter cannot be operated to obtain the required gain value (a threshold gain value). At this moment, if the switch S3 is turned on (i.e., the right of FIG. 4(A)), compared with the initial state, the $C_r$ value of the resonant tank will be changed from a fixed value to a variable $C_r'$ (i.e., $C_r'=C_r+C_{r1}$), which includes the initial fixed resonant capacitor $C_r$ electrically coupled to the first capacitor $C_{r1}$, and the equivalent resonant tank parameter $C_r'$ (that is, the variable resonant capacitance) can be adjusted by turning on the switch S3 to obtain the varied Q parameter (changed from Qc to Qd) while maintaining K, as shown in FIG. 4(B). In this state, if the required $I_o$ of the LLC resonant converter increases, the value of Q changes from Qc to Qd, corresponding curves depict gain $M(f_s, K, Q)$ of the LLC resonant converter versus operating frequency $f_s$ according to the change of the values of Q are illustrated as curves 421 and 423 in FIG. 4(B). That is, under the same K, while the curves of gain $M(f_s, K, Q)$ of the LLC resonant converter varies from Qc to Qd, the corresponding maximum DC gain of Qd (curve 423) is still greater than the threshold gain value 1.5, which can meet the gain requirement of the LLC resonant converter.

The examples mentioned above are only used as examples, and the ways of electrical coupling between $C_r$ and $C_{r1}$ can have many different combinations. According to different applications, the electrical coupling between $C_r$ and $C_{r1}$ can be chosen in series or parallel, which are not listed here one by one. The above example is for illustrative purposes only, and is not intended to limit the scope of the claims of the present invention.

In one embodiment, the capacitance of the first capacitor $C_{r1}$ can be a stray capacitance or an external capacitance, and the capacitance value in the resonant tank can be varied through coupling $C_r$ and $C_{r1}$ in series or in parallel by any form of switch such as a switching element, a relay, or the like.

In an embodiment, arrangement of capacitors $C_r$ and $C_{r1}$ coupled in series or in parallel to change the capacitance value in the resonant tank can be achieved by configuring a plurality of switches between different capacitors.

Figure 5A:
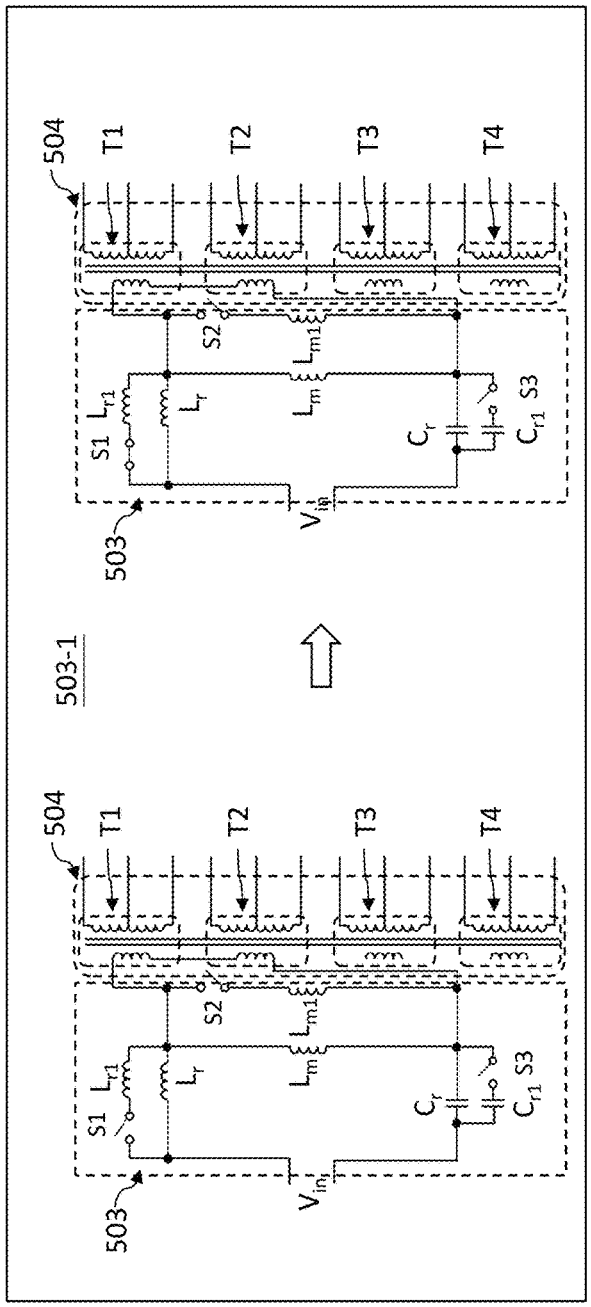
FIG. 5(A) illustrates a schematic circuit diagram of a resonant tank design of an LLC resonant converter according to another preferred embodiment of the present invention.
Figure 5B:
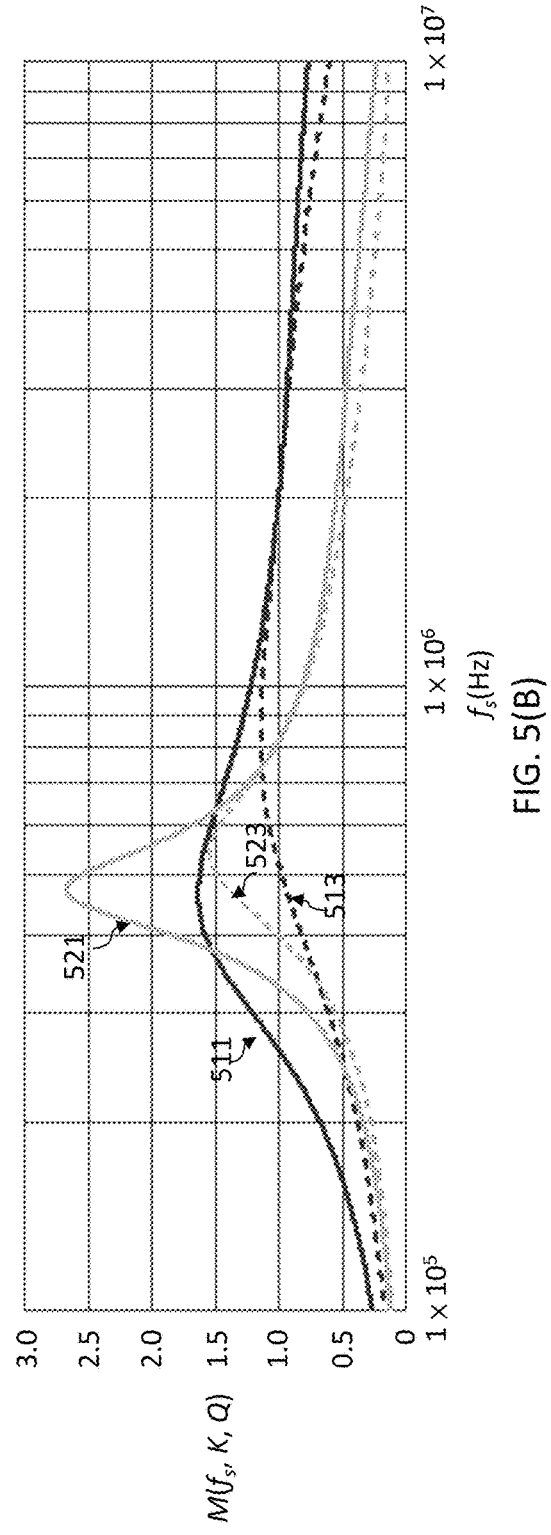
FIG. 5(B) illustrates comparison of gain curves between the proposed resonant tank design according to FIG. 5(A) and the original resonant tank design.

FIG. 5(A) shows the circuit block 503-1 of the resonant tank 503 coupled to the transformer circuit 504 of the circuit of the LLC resonant power converter with PCB windings and also illustrates how to change the resonant tank by adjusting the external $L_r$ after the transformer primary side windings are selected and configured in series (same as FIG. 3). In the initial state, the parameters of the resonant tank are fixed, that is, the resonant tank in the diagram (left of FIG. 5(A)), the switches S1, S2 and S3 are turned off. In the initial state, while the parameters of the resonant are fixed, varying the values of $I_o$ and $V_o$ will also change the Q value. In the initial state, curves depict gain $M(f_s, K, Q)$ of the LLC resonant converter versus operating frequency $f_s$ according to the change of the values of Q are illustrated as curves 511 and 513 in FIG. 5(B). In the initial state, if the required $I_o$ of the LLC resonant converter increases, the value of Q changes from Q1 to Q2, and the maximum DC gain changes from more than 1.5 (curve 511) to lower than 1.5 (curve 513), the LLC resonant converter cannot be operated to obtain the required gain value (a threshold gain value). At this moment, if the switch S1 is turned on (i.e., the right of FIG. 5(A)), compared with the initial state, the $L_r$ value of the resonant tank will be changed from a fixed value to a variable $L_r'$ (i.e., $L_r'=L_r//L_{r1}$), which includes the initial fixed resonant inductor $L_r$ electrically coupled to the second inductor $L_{r1}$, and the equivalent resonant tank parameter $L_r'$ (that is, the variable resonant inductor) can be adjusted by turning off the switch S1 to obtain the both varied K and Q parameters. As shown in FIG. 5(B), in this state, if the required $I_o$ of the LLC resonant converter increases, the value of K changes from K to K2 while the value of Q changes from Q3 to Q4, corresponding curves depict gain $M(f_s, K, Q)$ of the LLC resonant converter versus operating frequency $f_s$ according to the change of the values of K's and Q's are illustrated as curves 521 and 523 in FIG. 5(B). That is, under the above conditions, while the curves of gain $M(f_s, K, Q)$ of the LLC resonant converter varies from K, Q3 to K2, Q4, the corresponding maximum DC gain of K2, Q4 (curve 523) is still greater than the threshold gain value 1.5, which can meet the gain requirement of the LLC resonant converter.

The examples mentioned above are only used as examples, and the ways of electrical coupling between $L_r$ and $L_{r1}$ can have many different combinations. According to different applications, the electrical coupling between $L_r$ and $L_{r1}$ can be chosen in series or parallel, which are not listed here one by one. The above example is for illustrative purposes only, and is not intended to limit the scope of the claims of the present invention.

In one embodiment, inductance of the second inductor $L_{r1}$ can be the leakage inductance of the transformer itself or an external coupled inductance, which can be obtained through changing the windings of the magnetic element by any form of switches such as a switching element or a relay, or through connecting external magnetic element in series or in parallel by any form of switch such as a switching element, a relay, or the like.

In an embodiment, arrangement of inductor $L_r$ and $L_{r1}$ coupled in series or in parallel to change the inductance value in the resonant tank can be achieved by configuring a plurality of switches between different inductors.

In one embodiment, the switches S1, S2 and S3 may be switches in any form, such as switching elements, transistor switches, or relays.

Figure 6:
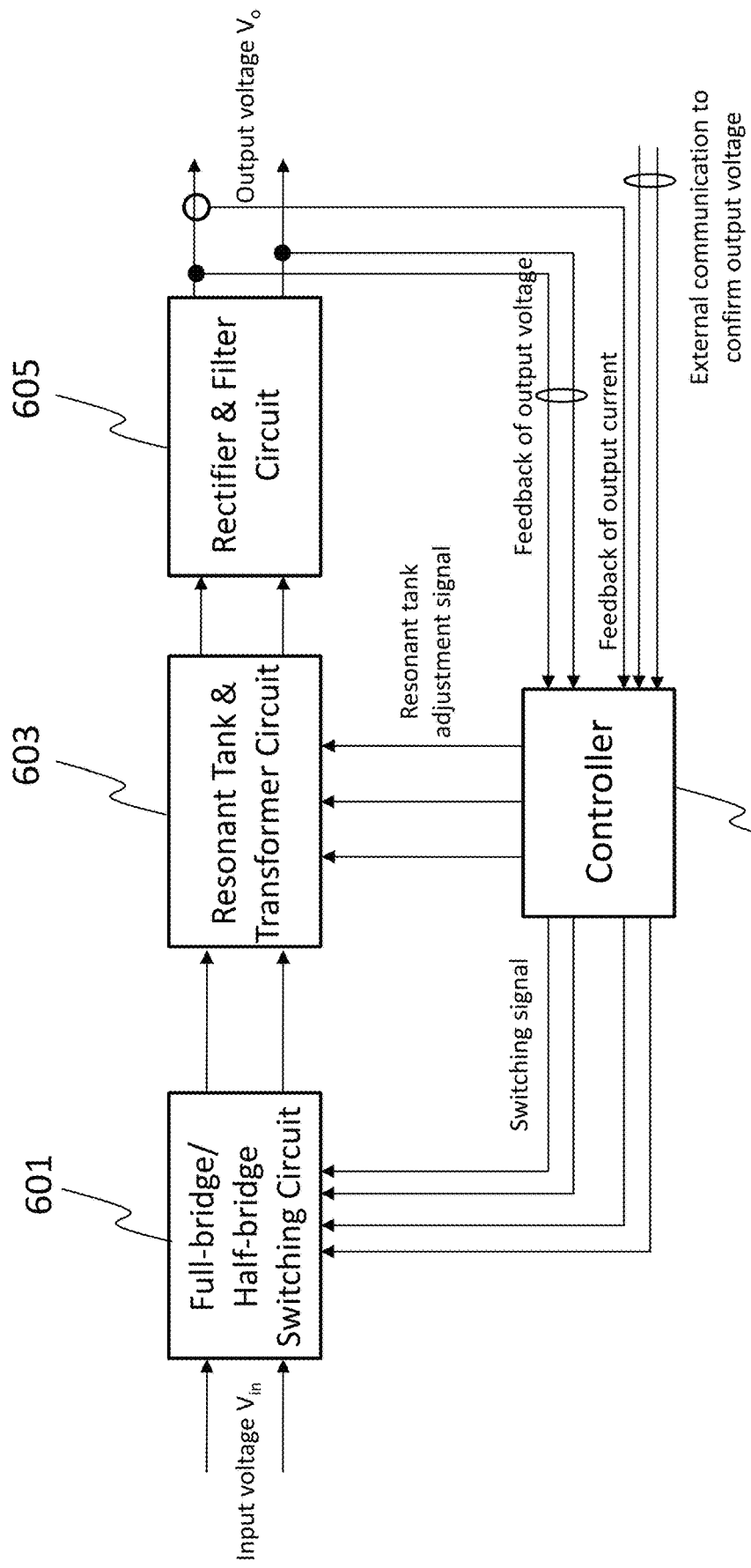
FIG. 6 illustrates a circuit block diagram and related operation control flow of an LLC resonant converter according to a preferred embodiment of the present invention.

FIG. 6 shows a circuit block diagram and a related operation control flow of an LLC resonant converter. The LLC resonant converter is used to convert an input DC voltage $V_{in}$ into an output DC voltage $V_o$ for supplying the load, which includes a full-bridge/half-bridge switching circuit 601, a resonant tank and transformer circuit 603, a rectifying and filtering circuit 605 and an external control circuit 607. The full-bridge/half-bridge switching circuit 601 is used to introduce a periodically changing switching signal input to the resonant tank and transformer circuit 603 coupled to it, through the external control circuit 607 by controlling turn-on or turn-off of the upper-bridge switches or the lower-bridge switches of the full-bridge/half-bridge switching circuit 601, enabling the current fed into the resonant tank and transformer circuit 603 repeatedly to generate voltage and induction electromotive force according to a sinusoidal law. The rectifying and filtering circuit 605 coupled to the secondary winding of the resonant tank and transformer circuit 603 rectifies and filters the varying current of the secondary winding to generate DC current $I_o$ and output DC voltage $V_o$ to be used by a load.

Functional block of the resonant tank and transformer circuit 603 contains a resonant tank (including $L_r$, $L_m$ and $C_r$ connected in series) coupled the full-bridge/half-bridge switching circuit 601 and a transformer circuit (including magnetic core, primary side winding $N_p$ and secondary winding $N_s$) coupled to the rectifying and filtering circuit 605. Among them, the specific implementation and design concept of the resonance tank and the transformer circuit 603 of the LLC resonant converter that proposed in the present invention can be referred to FIGS. 2-5. During the operation of the LLC resonant converter, the rectifying and filtering circuit 605 rectifies and filters the input signal (current or voltage) fed to the secondary side, and converts it into a DC output to provide DC output voltage $V_o$ to the load. The external control circuit 607 is coupled to the full-bridge/half-bridge switching circuit 601, the resonant tank and transformer circuit 603, and the rectifying and filtering circuit 605. The external control circuit 607 receives feedback of the output voltage, feedback of the output current and the external communication signals (to confirm the output voltage) of the LLC resonant converter, and can control the turn-on or turn-off of the upper-bridge switches or the lower-bridge switches in the full-bridge/half-bridge circuit 601 according to the feedback of output voltage, the feedback of output current and the external communication signals. In addition, the received feedback of output voltage and feedback of output current can be respectively used to adjust the resonant tank of the LLC resonant converter by sending resonant tank adjustment signals from the external controller 607. Therefore, inductance value of the magnetizing inductor $L_m$, capacitance value of the resonant capacitor $C_r$ and inductance value of the resonant inductor $L_r$ can be dynamically adjusted to achieve the purpose of varying the range of output voltage and output current of the LLC resonant converter.

In a preferred embodiment, the external control circuit 607 can be a microprocessor, a microcontroller (MCU), a digital signal processor (DSP) or a computing processing device with similar functions.

Basically, once the circuit topology of the LLC resonant converter is finalized, its resonant tank parameters $L_r$, $L_m$ and $C_r$ are determined and cannot be adjusted for different operating scenarios. That is, the range of its output voltage and output current cannot be adjusted according to its operational needs.

In the present invention, the switching frequency (operating frequency) $f_s$ is operated above Mega Hz to reduce the size of the magnetic components of the LLC resonant converter, and the stray characteristics of the magnetic components are reduced by utilizing the printed circuit board windings as well. The parameters of the resonant tank can be slightly adjusted through the series-parallel connection of the transformer windings fabricated on PCBs or be dynamically adjusted through external coupled $L_{r1}$, $L_{m1}$ and $C_{r1}$, enabling that the range of output voltage and/or current of the LLC resonant power converter can be widened.

While various embodiments of the present invention have been described above, it should be understood that they have been presented by a way of example and not limitation. Numerous modifications and variations within the scope of the invention are possible. The present invention should only be defined in accordance with the following claims and their equivalents.

What is claimed is:

1. An LLC converter with windings fabricated on printed circuit board (PCB), said LLC converter comprising:
   a switching circuit electrically coupled to an input DC voltage for converting said input DC voltage into a switching signal;
   a resonant tank electrically coupled to said switching circuit, said resonant tank including a resonant inductor, a magnetizing inductor and a resonant capacitor connected in series to receive said switching signal for providing primary current;
   a transformer circuit electrically coupled to said resonant tank, said transformer circuit having a plurality of discrete transformers, each of said plurality of discrete transformers with a primary winding and a secondary winding, wherein said primary winding and said secondary winding are fabricated on a printed circuit board (PCB) to reduce influence of stray characteristics caused by said primary winding and said secondary winding;
   wherein primary winding of each of said discrete transformers is dynamically selected to be electrically coupled or isolated from said resonant tank, and is dynamically selected to be connected in series or in parallel with primary winding of other discrete transformers to form a dynamically varying equivalent primary winding, and enable parameters of said resonant tank to be tuned accordingly while maintaining turns ratio of said transformer circuit; and
   a rectifying and filtering circuit electrically coupled to said transformer circuit to rectify and filter a secondary current for providing an output voltage;
   wherein one end of said resonant inductor is connected in series to said switching circuit and another end of said resonant inductor is connected in series to said equivalent primary winding;
   wherein said magnetizing inductor is connected in series to said resonant capacitor, said resonant capacitor with one end is connected in series to said magnetizing inductor and another end is connected to said switching circuit; and
   wherein said magnetizing inductor is connected in parallel to said equivalent primary winding;
   wherein gain curve of said LLC resonant power converter is dynamically adjusted by electrically coupling an external excitation inductor, an external resonant inductor or an external capacitor to said resonant tank according to output current requirement of said LLC resonant power converter.

2. The LLC converter with windings fabricated on PCBs of claim 1, wherein said equivalent primary winding of said transformer circuit, said external magnetizing inductor, said external resonant inductor or said external capacitor electrically coupled to said resonant tank is dynamically adjusted by configuring a plurality of switches in said LLC converter.

3. The LLC converter with windings fabricated on PCB of claim 2, wherein said plurality of switches are switching devices, transistors, relays or the like.

4. The LLC converter with windings fabricated on PCB of claim 2, wherein inductance of said external magnetizing inductor is leakage inductance of said transformer circuit or inductance of a coupled external inductor, said inductance of said external magnetizing inductor is adjusted through varying windings of magnetic component of said resonant tank or through coupling external magnetic elements in series or in parallel by arranging said plurality of switches.

5. The LLC converter with windings fabricated on PCB of claim 4, wherein said inductance of said external magnetizing inductor is dynamically adjusted by varying one of said parameters of said resonant tank K, which is inductance ratio, enabling that said gain curve of said LLC resonant converter is dynamically varied according to said output current requirement of said LLC resonant power converter.

6. The LLC converter with windings fabricated on PCB of claim 2, wherein said external capacitor is circuit stray capacitor or external capacitor, and capacitance of said resonant tank is varied through adjusting configurations between said external capacitor and said resonant capacitor by arranging said plurality of switches.

7. The LLC converter with windings fabricated on PCB of claim 6, wherein capacitance of said external capacitor is dynamically adjusted by varying one of said parameters of said resonant tank Q, which is quality factor, enabling that said gain curve of said LLC resonant converter is dynamically varied according to said output current requirement of said LLC resonant power converter.

8. The LLC converter with windings fabricated on PCB of claim 2, wherein inductance of said external resonant inductor is leakage inductance of said transformer circuit or inductance of a coupled external inductor, said inductance of said external resonant inductor is adjusted through varying windings of magnetic component of said resonant tank or through coupling external magnetic elements in series or in parallel by arranging said plurality of switches.

9. The LLC converter with windings fabricated on PCB of claim 8, wherein said inductance of said resonant magnetizing inductor is dynamically adjusted by varying two of said parameters of said resonant tank K and Q, which are inductance ratio and quality factor respectively, enabling that said gain curve of said LLC resonant converter is dynamically varied according to said output current requirement of said LLC resonant power converter.

10. The LLC converter with windings fabricated on PCB of claim 2, wherein said plurality of switches are configured to dynamically adjust parameters of said resonant tank and winding configuration of said transformer circuit, by sending resonance tank adjustment signals to said resonant tank and said transformer circuit, through an external controller electrically coupled to said LLC resonant converter, according to received feedback of output voltage and feedback of output current respectively to adjust range of output voltage and output current of said LLC resonant power converter.

11. An LLC converter with windings fabricated on printed circuit board (PCB), said LLC converter comprising:

a switching circuit electrically coupled to an input DC voltage for converting said input DC voltage into a switching signal;

a resonant tank electrically coupled to said switching circuit, said resonant tank including a resonant inductor, a magnetizing inductor and a resonant capacitor connected in series to receive said switching signal for providing primary current;

a transformer circuit electrically coupled to said resonant tank, said transformer circuit having a plurality of discrete transformers, each of said plurality of discrete transformers with a primary winding and a secondary winding, wherein said primary winding and said secondary winding are fabricated on a printed circuit boards (PCB) to reduce influence of stray characteristics caused by said primary winding and said secondary winding, wherein said PCB include a plurality of through holes, a plurality of layers and a plurality of windings, and locations of said plurality of through holes corresponding to said magnetic cores of said plurality of discrete transformers to make each of said magnetic cores passing through corresponding said plurality of through holes; wherein said plurality of windings arranged on each layer of said plurality of layers of said PCB surround corresponding magnetic cores of said plurality of discrete transformers to generate induced electromotive force, said windings arranged on said plurality of layers of said PCB include said primary winding or said secondary side winding;

wherein primary winding of each of said discrete transformers is dynamically selected to be electrically coupled or isolated from said resonant tank, and is dynamically selected to be connected in series or in parallel with primary winding of other discrete transformers to form a dynamically varying equivalent primary winding, and enable parameters of said resonant tank to be tuned accordingly while maintaining turns ratio of said transformer circuit; and a rectifying and filtering circuit electrically coupled to said transformer circuit to rectify and filter a secondary current for providing an output voltage;

wherein one end of said resonant inductor is connected in series to said switching circuit and another end of said resonant inductor is connected in series to said equivalent primary winding;

wherein said magnetizing inductor is connected in series to said resonant capacitor, said resonant capacitor with one end is connected in series to said magnetizing inductor and another end is connected to said switching circuit; and wherein said magnetizing inductor is connected in parallel to said equivalent primary winding;

wherein gain curve of said LLC resonant power converter is dynamically adjusted by electrically coupling an external excitation inductor, an external resonant inductor or an external capacitor to said resonant tank according to output current requirement of said LLC resonant power converter.

12. The LLC converter with windings fabricated on PCB of claim 11, wherein said equivalent primary winding of said transformer circuit, said external magnetizing inductor, said external resonant inductor or said external capacitor electrically coupled to said resonant tank is dynamically adjusted by configuring a plurality of switches in said LLC converter.

13. The LLC converter with windings fabricated on PCB of claim 12, wherein said plurality of switches are switching devices, transistors, relays or the like.

14. The LLC converter with windings fabricated on PCB of claim 12, wherein said inductance of said external magnetizing inductor is leakage inductance of said transformer circuit or inductance of a coupled external inductor, said inductance of said external magnetizing inductor is adjusted through varying windings of magnetic component of said resonant tank or through coupling external magnetic elements in series or in parallel by arranging said plurality of switches.

15. The LLC converter with windings fabricated on PCB of claim 14, wherein said inductance of said external magnetizing inductor is dynamically adjusted by varying one of said parameters of said resonant tank K, which is inductance ratio, enabling that said gain curve of said LLC resonant converter is dynamically varied according to said output current requirement of said LLC resonant power converter.

16. The LLC converter with windings fabricated on PCB of claim 12, wherein said external capacitor is circuit stray capacitor or external capacitor, and capacitance of said resonant tank is varied through adjusting configurations between said external capacitor and said resonant capacitor by arranging said plurality of switches.

17. The LLC converter with windings fabricated on PCB of claim 16, wherein capacitance of said external capacitor is dynamically adjusted by varying one of said parameters of said resonant tank Q, which is quality factor, enabling that said gain curve of said LLC resonant converter is dynamically varied according to said output current requirement of said LLC resonant power converter.

18. The LLC converter with windings fabricated on PCB of claim 12, wherein inductance of said external resonant inductor is leakage inductance of said transformer circuit or inductance of a coupled external inductor, said inductance of said external resonant inductor is adjusted through varying windings of magnetic component of said resonant tank or through coupling external magnetic elements in series or in parallel by arranging said plurality of switches.

19. The LLC converter with windings fabricated on PCB of claim 18, wherein said inductance of said resonant magnetizing inductor is dynamically adjusted by varying two of said parameters of said resonant tank K and Q, which are inductance ratio and quality factor respectively, enabling that said gain curve of said LLC resonant converter is dynamically varied according to said output current requirement of said LLC resonant power converter.

20. The LLC converter with windings fabricated on PCB of claim 12, wherein said plurality of switches are configured to dynamically adjust parameters of said resonant tank and winding configuration of said transformer circuit, by sending resonance tank adjustment signals to said resonant tank and said transformer circuit, through an external controller electrically coupled to said LLC resonant converter, according to received feedback of output voltage and feedback of output current respectively to adjust range of output voltage and output current of said LLC resonant power converter.

* * * * *